United States Patent
Wells et al.

(10) Patent No.: US 7,906,830 B2
(45) Date of Patent: Mar. 15, 2011

(54) EPITAXIAL SILICON GROWTH

(75) Inventors: David H. Wells, Boise, ID (US); Du Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 12/337,292

(22) Filed: Dec. 17, 2008

(65) Prior Publication Data

US 2009/0095997 A1  Apr. 16, 2009

Related U.S. Application Data

(63) Continuation of application No. 11/543,560, filed on Oct. 4, 2006, now Pat. No. 7,498,265.

(51) Int. Cl.
*H01L 29/00* (2006.01)

(52) U.S. Cl. ........ 257/521; 257/347; 257/315; 257/351; 257/E21.17; 257/E21.229; 257/E21.278; 257/E21.304; 257/E21.32; 257/E21.545; 257/E21.562; 257/E21.646

(58) Field of Classification Search .................. 257/296, 257/347, 315, 316, 351, 521, 527, 627, 628, 257/E21.229, 278, 304, 32, 545, 562, 646
See application file for complete search history.

(56) References Cited

U.S. PATENT DOCUMENTS

| | | | | |
|---|---|---|---|---|
| 5,360,937 A | * | 11/1994 | Jackson | 568/348 |
| 5,633,519 A | * | 5/1997 | Yamazaki et al. | 257/315 |
| 5,789,306 A | | 8/1998 | Roberts et al. | |
| 5,792,685 A | | 8/1998 | Hammerl et al. | |
| 6,245,615 B1 | | 6/2001 | Noble et al. | |
| 6,682,873 B2 | | 1/2004 | Michiels et al. | |
| 6,867,460 B1 | | 3/2005 | Anderson et al. | |
| 7,045,880 B2 | * | 5/2006 | Noble et al. | 257/628 |
| 7,208,803 B2 | | 4/2007 | Ting | |
| 7,323,274 B1 | | 1/2008 | Samii et al. | |
| 7,498,265 B2 | * | 3/2009 | Wells et al. | 438/700 |
| 2007/0228425 A1 | | 10/2007 | Miller et al. | |
| 2007/0281493 A1 | | 12/2007 | Fuesko et al. | |
| 2008/0099785 A1 | | 5/2008 | Bai et al. | |

\* cited by examiner

*Primary Examiner* — David Nhu

(74) *Attorney, Agent, or Firm* — Brooks, Cameron & Huebsch, PLLC

(57) ABSTRACT

Memory cell structures, including PSOIs, NANDs, NORs, FinFETs, etc., and methods of fabrication have been described that include a method of epitaxial silicon growth. The method includes providing a silicon layer on a substrate. A dielectric layer is provided on the silicon layer. A trench is formed in the dielectric layer to expose the silicon layer, the trench having trench walls in the <100> direction. The method includes epitaxially growing silicon between trench walls formed in the dielectric layer.

17 Claims, 16 Drawing Sheets

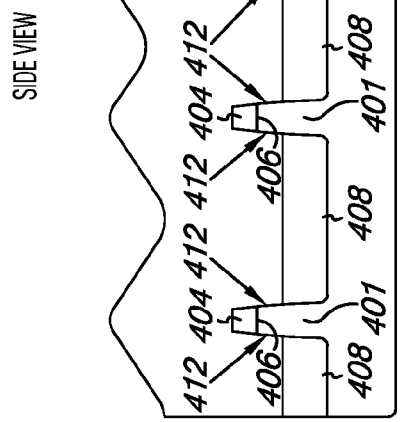
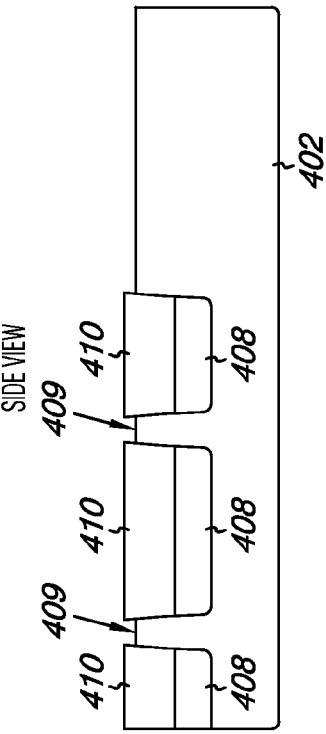
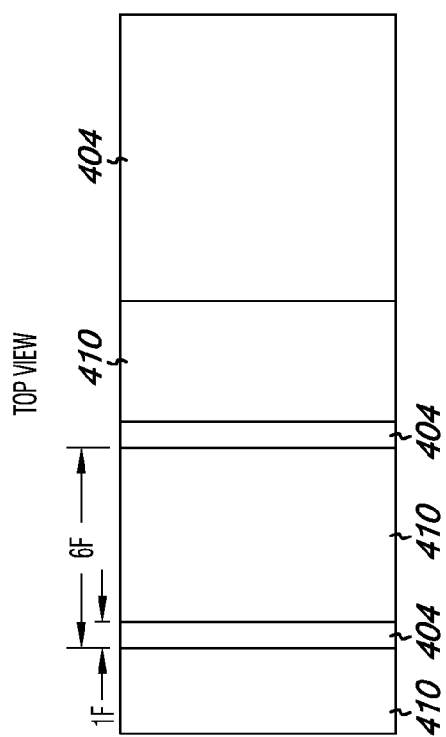
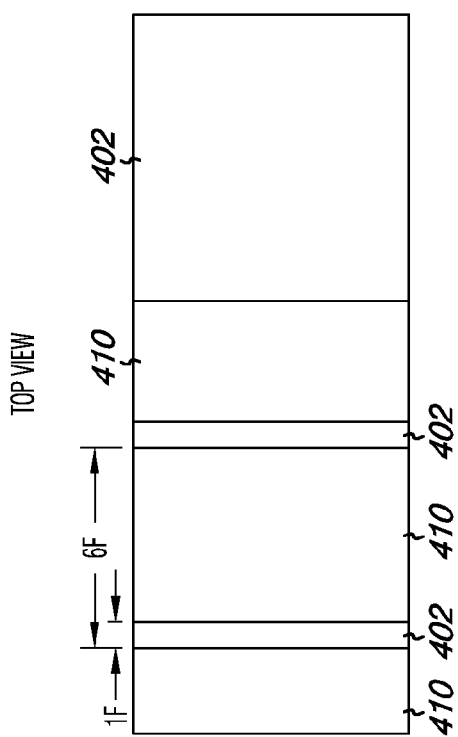

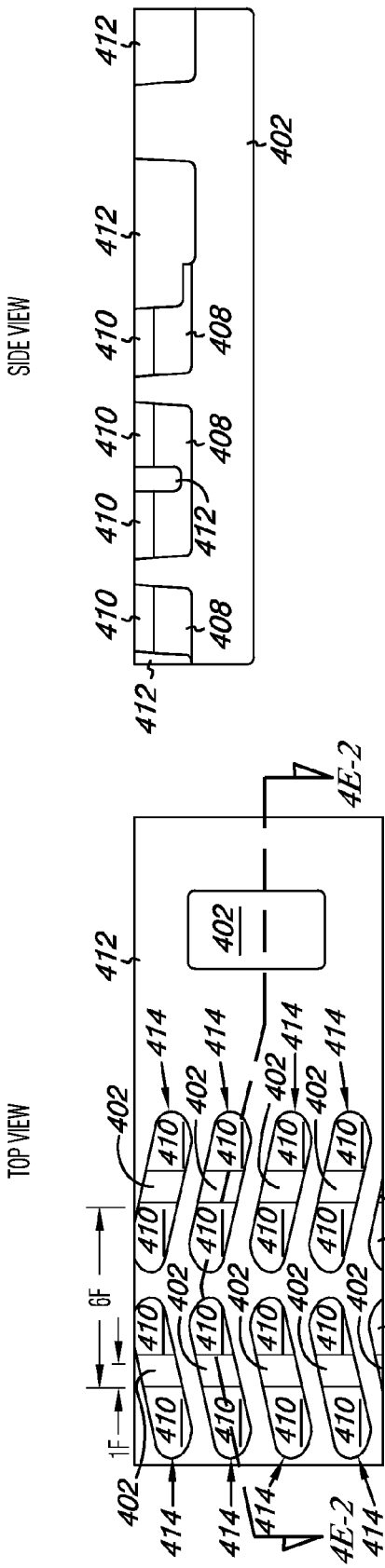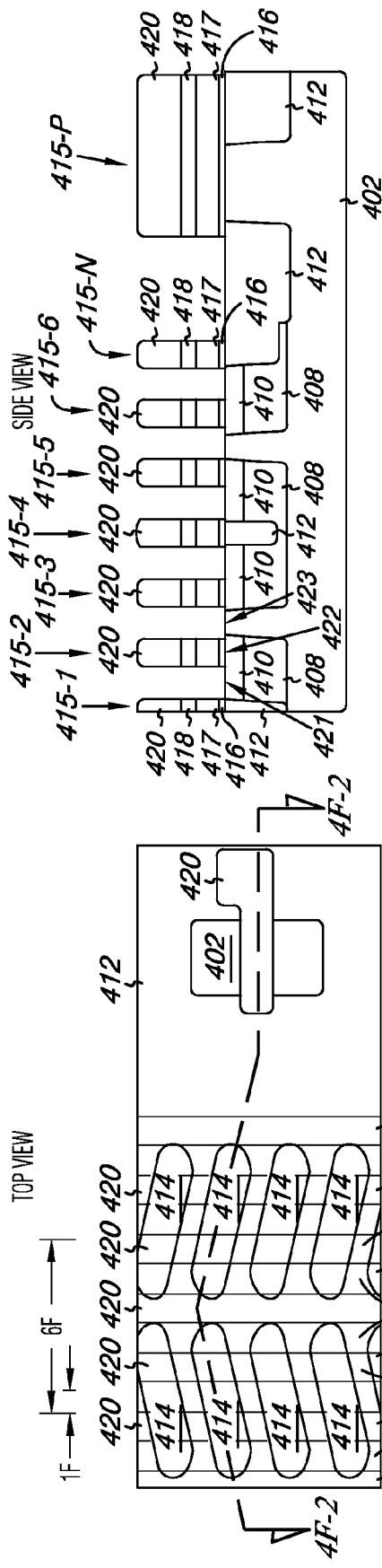

TOP VIEW

SIDE VIEW

TOP VIEW

SIDE VIEW

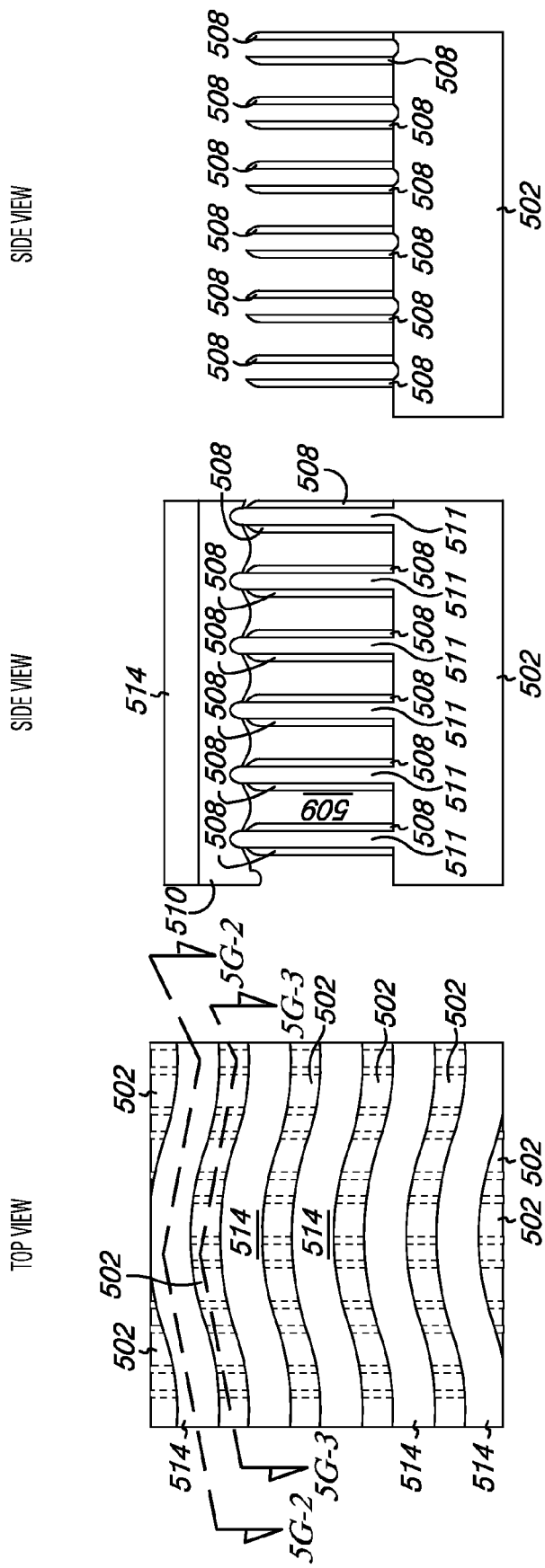

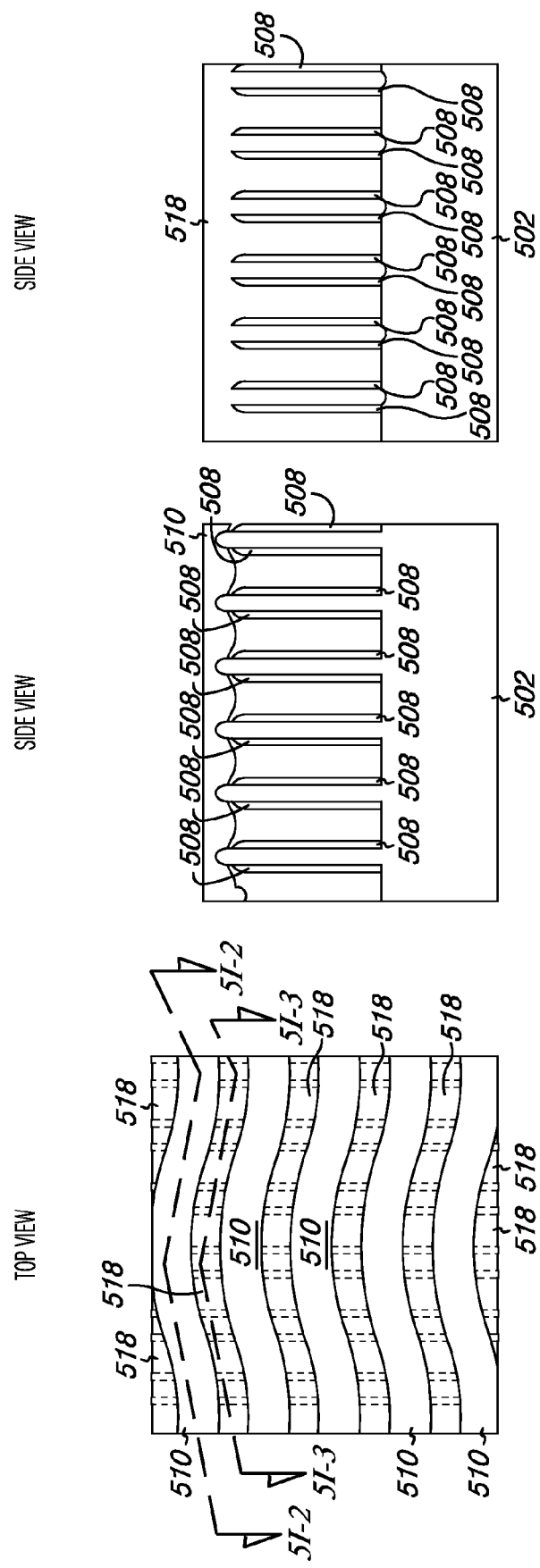

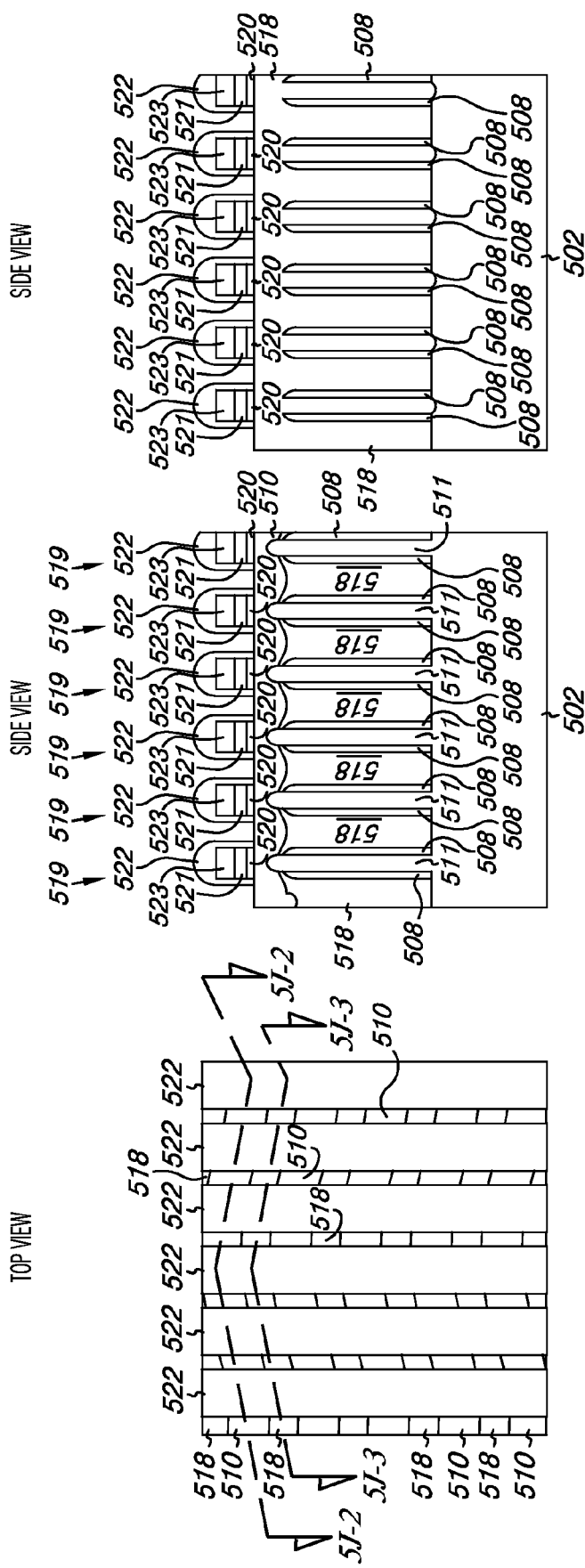

EPITAXIAL SILICON GROWTH

CROSS-REFERENCE TO RELATED APPLICATIONS

The application is a continuation of U.S. application Ser. No. 11/543,560 filed Oct. 4, 2006, now U.S. Pat. No. 7,498,265, the entire specification of which is incorporated herein by reference.

TECHNICAL FIELD

The present disclosure relates generally to semiconductor devices and, more particularly, to semiconductor devices formed from epitaxial silicon growth.

BACKGROUND

Higher performance, lower cost, increased miniaturization of semiconductor components, and greater packing density of integrated circuit are ongoing goals of the semiconductor industry. Integrated circuit (IC) processing/fabrication is used to produce transistors having various structures including recessed access device (RAD), Fin field effect transistor (Fin-FET), pseudo silicon on insulator (PSOI), and nanowire, etc., for use in dynamic random access memory (DRAM), NOR and NAND Flash memory, and floating body memory, among other semiconductor devices.

IC processing for memory and other semiconductor devices are currently performed on silicon wafers having a top surface of (100) crystal plane. This surface structures was chosen over the previously used (111) crystal plane because of its comparatively low surface state density on thermally oxidized surfaces. For example, in the diamond lattice of silicon the (111) plane is more densely packed than the (100) plane, and thus etch rates of {111} orientated surfaces are expected to be lower than those with {100} orientation. Bonding orientation of the different planes also contributes to etchant selectivity to exposed planes. One etchant that exhibits such orientation dependent etching properties consists of a mixture of KOH and isopropyl alcohol. For example, such a mixture may etch about one hundred times faster along (100) planes than along (111) planes.

Various chemistries have been used to etch silicon. For example, both single crystal and polycrystalline silicon may be wet etched in mixtures of nitric acid (HNO3) and hydrofluoric acid (HF). With use of such etchants, the etching may be isotropic. The reaction is initiated by the HNO3, which forms a layer of silicon dioxide on the silicon, and the HF dissolves the silicon oxide away. In some cases, water is used to dilute the etchant, with acetic acid (CH3COOH) used as a buffering agent.

Wafers having the top surface of {100} crystal plane are currently provided with a registration mark in the orthogonal <110> direction. IC processing of the wafer is then performed using this <110> registration mark. Hence, masks are aligned along the <110> direction.

Integrated circuitry can be fabricated relative to one or both of bulk semiconductor substrates, such as silicon wafers, and semiconductor on insulator (SOI) substrates. SOI forms a semiconductor layer, e.g., silicon, onto an insulator, e.g., silicon dioxide. One method of forming SOI circuitry, at least in part, includes epitaxially growing single crystalline silicon electively from a single crystalline surface. Unfortunately in some instances epitaxially grown silicon tends to form crystalline defects, known as dislocations and stacking faults, which can result in undesired leakage within or between the resulting fabricated devices.

BRIEF DESCRIPTION OF THE DRAWINGS

FIGS. 3A-1 through 3K-2 illustrate a NAND Flash process embodiment according to the present disclosure.

FIGS. 4A-1 through 4F-2 illustrate a dynamic random access memory (DRAM) process embodiment according to the present disclosure.

FIGS. 5A-1 through 5J-3 illustrates a pseudo silicon on insulator (PSOI) involving epitaxially grown single crystalline silicon process embodiment involving epitaxially grown single crystalline silicon according to the present disclosure.

DETAILED DESCRIPTION

Figure 1:
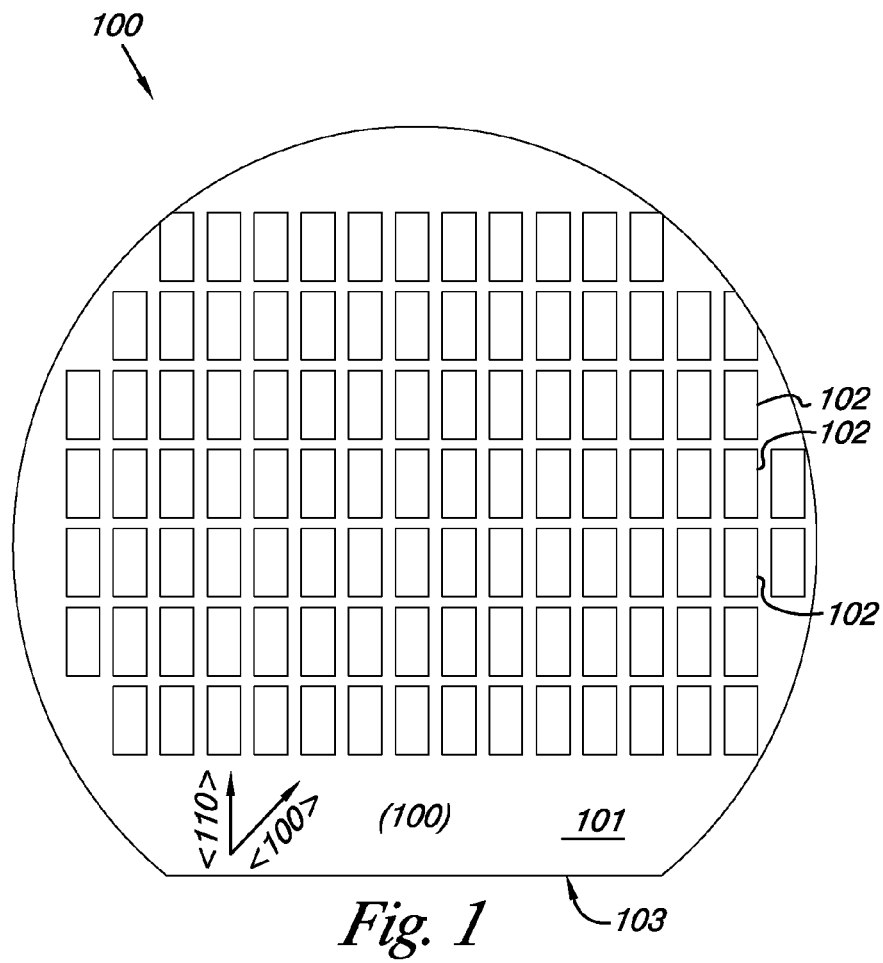
FIG. 1 illustrates an example silicon comprising semiconductor wafer.

Methods, devices, and arrays are described which include semiconductor devices formed from epitaxially grown silicon. Various embodiments reduce dislocations and/or defects in the epitaxial ("epi") silicon and resulting devices, arrays, etc.

One method embodiment includes providing a silicon layer on a substrate, the silicon having a top surface with a (100) crystal plane. A dielectric layer is provided on the silicon layer. As one example, providing a dielectric layer can include performing a high density plasma (HDP) oxide deposition on the silicon layer. A trench is formed in the dielectric layer to expose the silicon layer, the trench having trench walls in the <100> direction. The method includes epitaxially growing silicon between trench walls formed in the dielectric layer.

In some embodiments, the silicon layer is provided on a wafer having a registration mark in the <110> direction and the wafer is rotated such that the trench walls will be formed in the <100> direction, e.g., the wafer is rotated forty five degrees so that a mask is aligned in the <100> direction. Alternatively, the registration mark can be provided in the orthogonal <010> direction. In some embodiments, a pre-clean which includes exposing the silicon layer and the trench walls to a solution including a fluoride component, an oxidizing agent, and an inorganic acid, is performed prior to epitaxially growing silicon between the trench walls.

As used herein the terms "wafer" and "substrate" may include a number of semiconductor-based structures that have an exposed semiconductor surface. Structure can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "wafer" and "substrate" in the following description, previous process steps may have been utilized to form regions or junctions in or on the semiconductor structure and/or foundation. When reference is made to a substrate assembly, various process steps may have been previously used to form or define regions, junctions, various structures or features, and openings such as capacitor plates or barriers for capacitors.

As used herein, "layer" can refer to a layer formed on a substrate using a deposition process, e.g., plasma and/or chemical vapor deposition (CVD) process. The term "layer" is meant to include layers specific to the semiconductor industry, such as "barrier layer", "dielectric layer", and "conductive layer". The term "layer" is also meant to include layers found in technology outside of semiconductor technology, such as coatings on glass.

In the Figures, the first digit of a reference number refers to the Figure in which it is used, while the remaining two digits of the reference number refer to the same or equivalent parts of embodiment(s) of the present disclosure used throughout the several figures of the drawing. The scaling of the figures does not represent precise dimensions and/or dimensional ratios of the various elements illustrated herein.

FIG. 1 an example silicon comprising semiconductor wafer 100. The wafer includes a number of unsingulated die 102 for undergoing integrated circuit fabrication and processing thereupon. As shown in FIG. 1, such wafers 100 are provided with a registration mark, shown in this example as wafer edge 103, which is used to orient the integrated circuit fabrication and processing steps in the <110> direction. As shown, such wafers 100 are also provided with a top surface 101 exposing the (100) crystalline plane of the silicon thereon. Embodiments of the present disclosure, which are discussed more below, involve rotating the wafer 100 such that integrated circuit fabrication and processing are instead oriented along the <100> direction of the silicon crystalline structure provided on the wafer 100.

Figure 2:
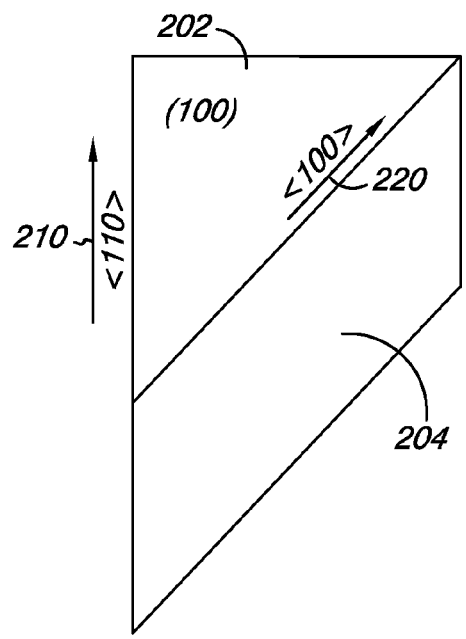
FIG. 2 is a three dimensional cross sectional view illustrating cuts oriented along different crystalline direction of the silicon comprising material.

FIG. 2 is a three dimensional cross sectional view illustrating cuts oriented along different crystalline direction of the silicon comprising material. The three dimensional view of FIG. 2 illustrate a top surface 202 having a (100) silicon crystal plane. FIG. 2 illustrates a three dimensional cut 210 as could be made into the silicon comprising material of the wafer in the <110> direction of silicon crystalline structure. FIG. 2 additionally illustrates a three dimensional cut 220 as is made into the silicon comprising material of the wafer along the <100> direction such that the walls, e.g., the surface 204, also run along the <100> direction and have a (100) silicon crystal plane. According to the embodiments described below, the wafer, e.g., wafer 100 shown in FIG. 1, is oriented such that integrated circuit fabrication and processing is performed with cuts being made into the silicon comprising material of the wafer to form walls in the <100> crystal direction versus the <110> crystal direction.

Figures 1, 3A:
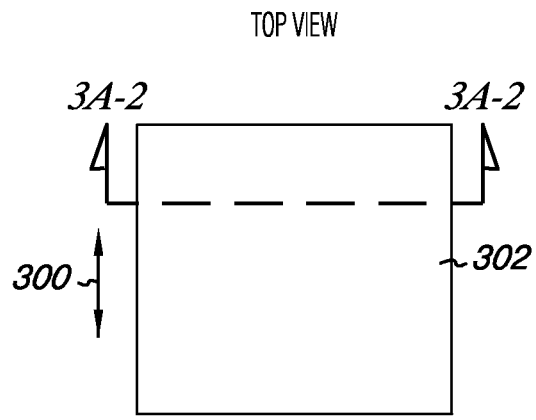
Figures 2, 3A:
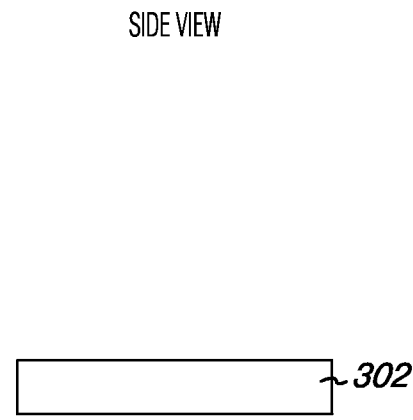

FIGS. 3A-1 through 3K-2 illustrate a NAND Flash process embodiment according to the present disclosure. FIG. 3A-1 illustrates a top view of a portion of a memory die, e.g., as can be formed on a semiconductor wafer as shown in FIG. 1. The illustrated portion is intended to represent that portion of a memory die whereupon a memory cell array is to be formed. The illustrated portion include a top surface 302 of single crystalline silicon having a (100) crystal plane. In the embodiment of FIG. 3A-1 the illustrated surface 302 can be etched to open the memory cell array while creating periphery shallow trench isolation (STI) on the die, as will be appreciated by one of ordinary skill in the art. Hence, FIG. 3A-2 illustrates a side view cross section taken along-cut line 3A-2 reflecting the recessed single crystalline silicon 302 in the memory cell array portion of the die.

Figures 1, 3B:
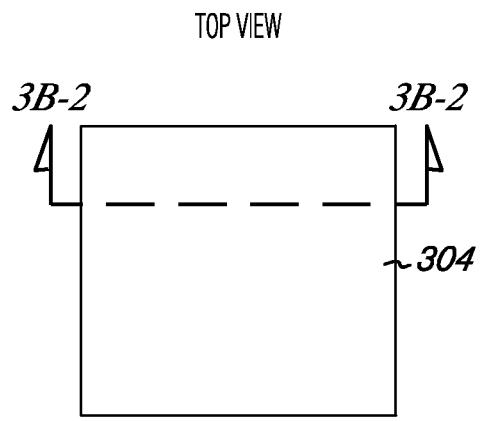
Figures 2, 3B:
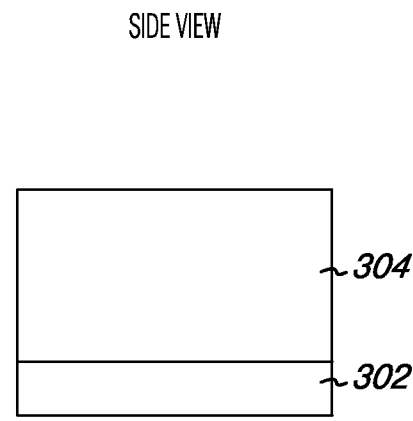

FIG. 3B-1 illustrates a top view of the portion of the die after a next sequence of processing steps. In FIG. 3B-1 a fill of dielectric material 304 is provided to the opened portions of the memory die. In various embodiments the dielectric fill is an STI oxide fill, e.g., using a dielectric such as TEOS. In FIGS. 3B-1 and 3B-2 the fill has been performed for the periphery of the array along with a subsequent planarization, e.g. chemical mechanical planarization (CMP). In the process that portion of the memory die whereupon a memory cell array is to be formed can also be concurrently filled with oxide 304 and planarized. FIG. 3B-2 provides the cross-sectional side view taken along cut line 3B-2 showing the oxide layer 304 formed above the single crystalline silicon 302.

Figures 1, 3C:
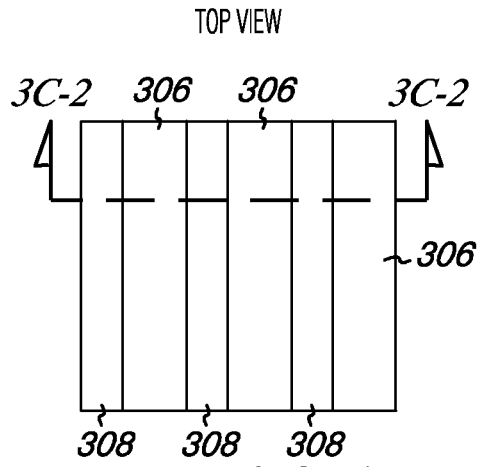
Figures 2, 3C:
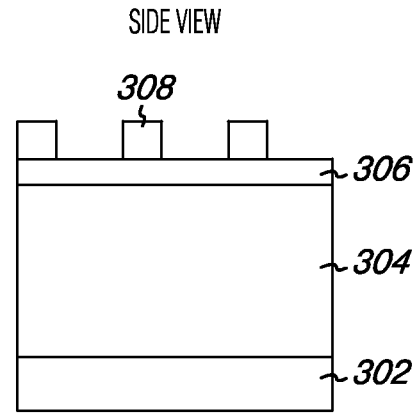

In FIG. 3C-1 a hardmask 308 is formed over the oxide layer 306 on the wafer, e.g., using photolithographic techniques. According to embodiments of the present disclosure, the hardmask 308 is patterned to form lines oriented in the <100> direction of the underlying single crystalline silicon. In various embodiments this can involve rotating a supporting wafer which has an original registration mark intended to orient processing steps in the <110> direction such that the process sequence will instead orient the hardmask 308 along the <100> direction of the underlying single crystalline silicon. FIG. 3C-2 provides the cross-sectional side view taken along cut line 3C-2. FIGS. 3C-1 and 3C-2 illustrate an optional additional dielectric layer, e.g., TiN layer, 306 which can be provided, e.g., using a chemical vapor deposition (CVD), to afford added smoothness and/or a sacrificial layer for removal later in the process flow. FIG. 3C-2 thus illustrates a side view of the hardmask 308 patterned in the <100> direction on the oxide layer 304 and an additional dielectric layer 306.

Figures 1, 3D:
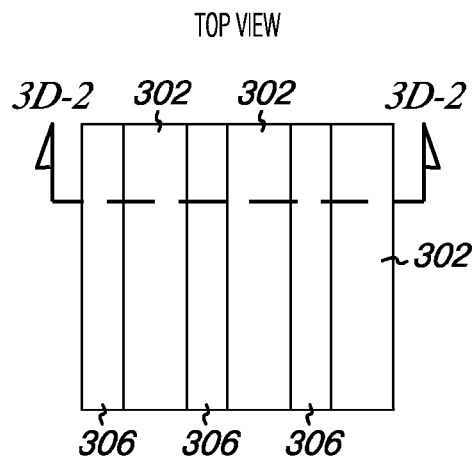
Figures 2, 3D:
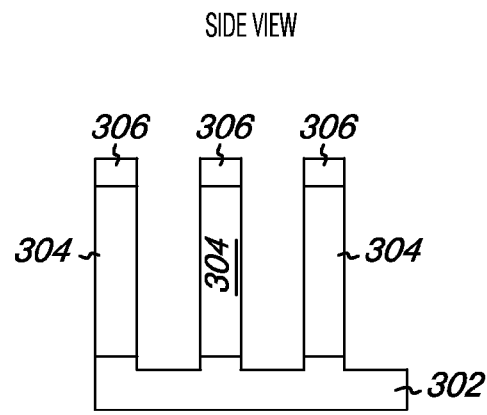

FIGS. 3D-1 and 3D-2 illustrate a top view and a side view of the portion of the die after a next sequence of processing steps. In FIGS. 3D-1 and 3D-2 the hardmask and oxide layer 306 have been etched, e.g., using a wet etch, plasma etch, or other suitable technique, etc., to expose the single crystalline silicon 302 with lines for the NAND array patterned in the <100> direction. Hence, what is shown in top view of FIG. 3D-1 are lines of the sacrificial dielectric layer 306 and lines of the exposed single crystalline silicon 302 oriented along the <100> direction of exposed single crystalline silicon 302. FIG. 3D-2 is the cross section taken along cut line 3D-2 illustrating the remaining sacrificial dielectric layer 306 on columns of oxide 304 and the exposed single crystalline silicon 302 underneath. The embodiments described herein have thus formed a number of trenches in the oxide dielectric material 304 having trench walls 305 in the <100> direction relative to the exposed the single crystalline silicon 302 underneath.

Figures 1, 3E:
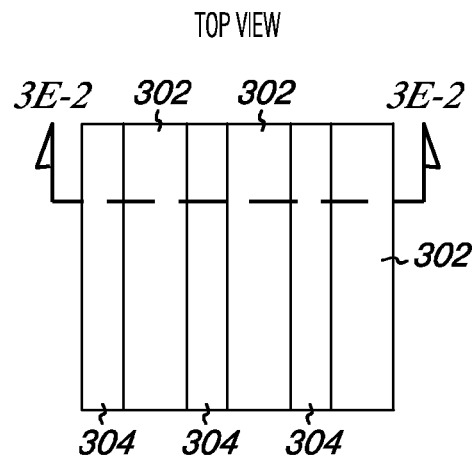
Figures 2, 3E:
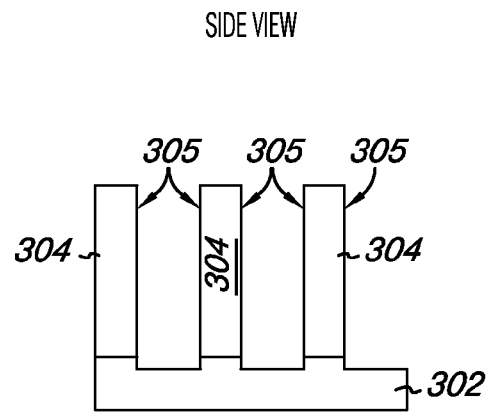

In FIG. 3E-1 the hardmask 308 and sacrificial dielectric layer 306 have been removed, e.g., using a selective etch, etc. According to various embodiments the exposed surfaces are pre-cleaned before next epitaxially growing single crystalline silicon between trench walls 305 formed in the oxide dielectric layer 304. FIG. 3E-2 is a cross sectional view showing the trench walls 305 formed in the oxide dielectric layer 304 with the exposed single crystalline silicon 302 below and therebetween. In various embodiments the pre-clean includes exposing the single crystalline silicon 302 to a solution including a fluoride component, an oxidizing agent, and an inorganic acid. One example of exposing the single crystalline silicon 302 to a solution including a fluoride component, an oxidizing agent, and an inorganic acid is provided in a copending, commonly assigned U.S. patent application entitled, "Wet Etch Suitable for Creating Square Cuts in Si and Resulting Structures", Ser. No. 11/445,718, filed Jun. 2, 2006, which is incorporated in full herein.

Figures 1, 3F:
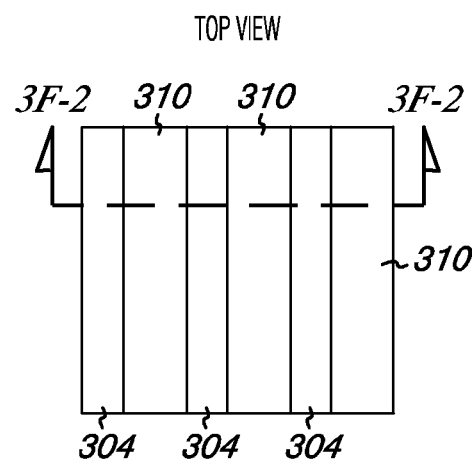
Figures 2, 3F:
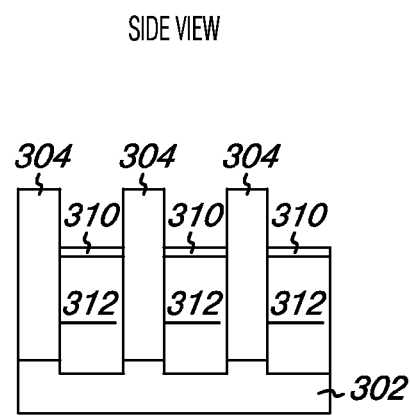

FIGS. 3F-1 and 3F-2 illustrate a top view and a side view of the portion of the die after a next sequence of processing steps. In FIGS. 3F-1 and 3F-2 single crystalline silicon 312 has been epitaxially grown from the exposed single crystalline silicon 302 in the channels formed by the walls of the trenches 305 in the oxide dielectric material 304. A pad oxide 310 can then be grown, e.g., $O_2$ or $H_2O$ diffusion, and planarized or etched back to provide the structure shown in FIGS. 3F-1 and 3F-2. According to the process embodiments described herein the epitaxially grown single crystalline silicon 312 is substantially free of dislocations. That is, due to the process of epitaxially growing the single crystalline silicon 312 between dielectric walls 304 oriented in the <100> direction relative to the exposed single crystalline silicon 302 any dislocations are pinned at the semiconductor/dielectric interface, e.g., along trench walls 305. Thus, according to this example embodiment, the low defects enables STI scaling of NAND Flash stripes down as far as oxide may be patterned without the complication of spin on dielectric (SOD) or high density plasma (HDP) fill and densification at STI. The oxide fins 304 created here can be approximately 20 nanometers (nm) wide which will allow STI scaling down to a feature size of 20 nm (F=20 nm).

In contrast, other process flows have tackled epitaxially growing single crystalline silicon over geometric features in silicon (Si) or silicon/germanium (Si/Ge) but these works have all directed their attention to dislocations being pinned at interfaces of the semiconductors. One example of this is provided in a copending, commonly assigned U.S. patent application entitled, "Integrated Circuits and Methods of Forming a Field Effect Transistor", application Ser. No. 11/076,774, filed Mar. 10, 2005, and which is incorporated in full herein.

Figures 1, 3G:
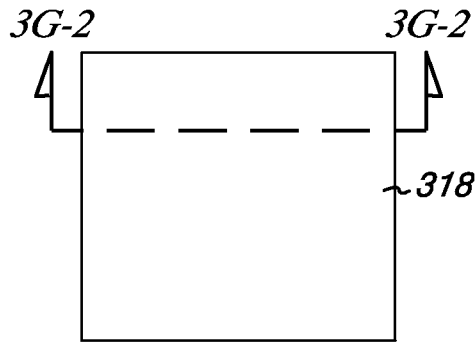
Figures 2, 3G:
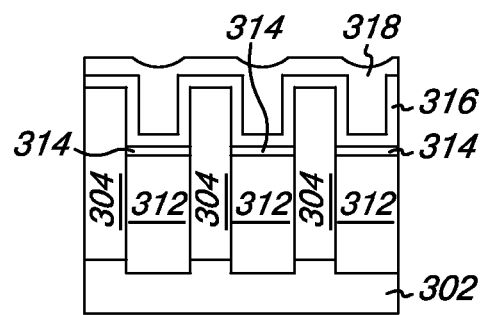

FIGS. 3G-1 and 3G-2 illustrate a top view and a side view of the portion of the die after a next sequence of processing steps. In FIGS. 3G-1 and 3G-2 implants to the cell array and array periphery work have been completed. Cell tunnel oxide 314 is grown from the pad oxide 310. The floating gate 316, e.g., polysilicon, can next be deposited, e.g., by CVD, etc., and a dielectric layer, sacrificial oxide 318 applied thereover, e.g., by SOD.

Figures 1, 3H:
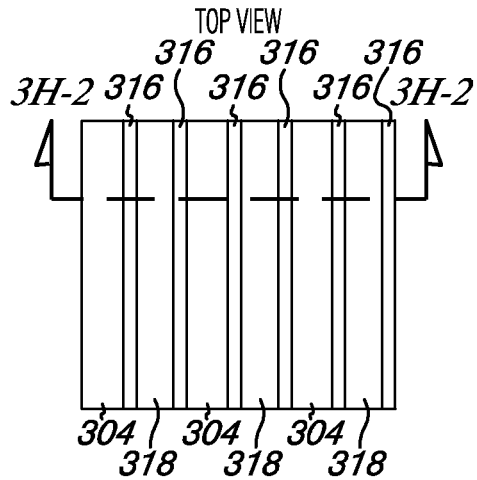
Figures 2, 3H:
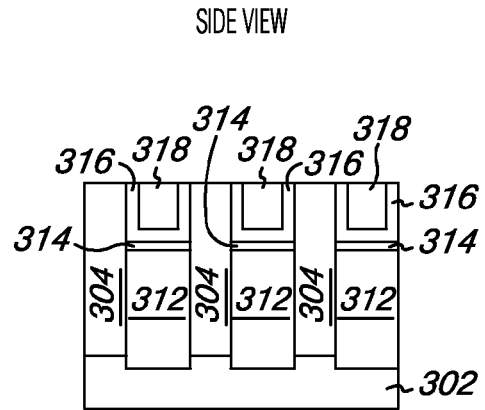

As shown in FIGS. 3H-1 and 3H-2, the structure can then be planarized, e.g., by CMP, down to the original STI oxide level, e.g., top surface level of the oxide dielectric layer 304, or optional sacrificial dielectric layer 306, e.g., nitride cap, if one was applied.

Figures 1, 3I:
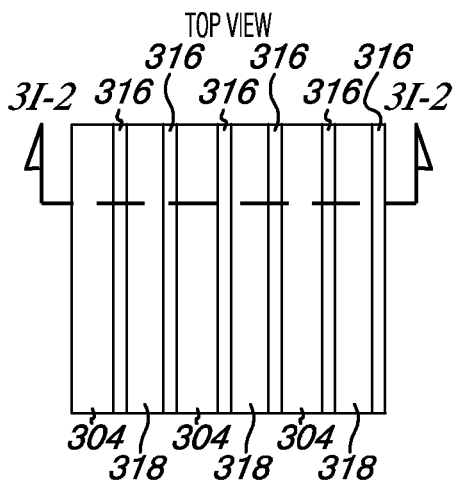
Figures 2, 3I:
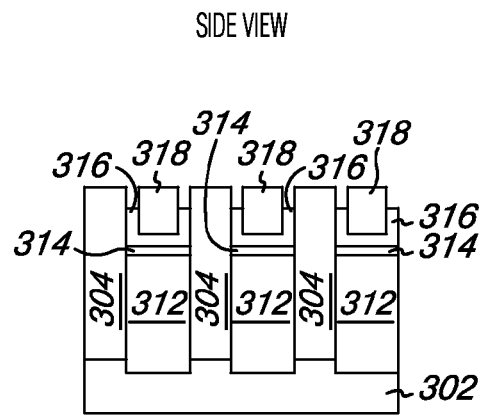

In FIGS. 3I-1 and 3I-2, the floating gate polysilicon 316 in the cell array can be recessed. The cell array structure is now appears in the top view illustration of FIG. 3I-1 and in the side view of FIG. 3I-2 taken along cut line 3I-2.

Figures 1, 3J:
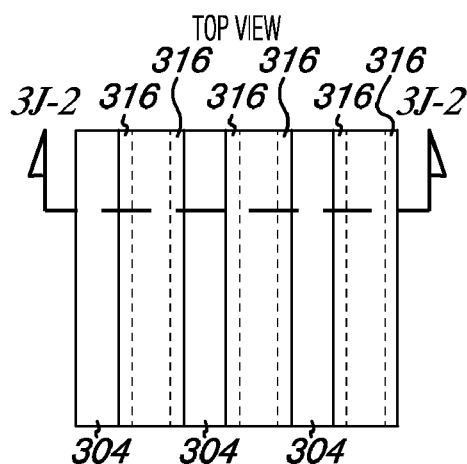
Figures 2, 3J:
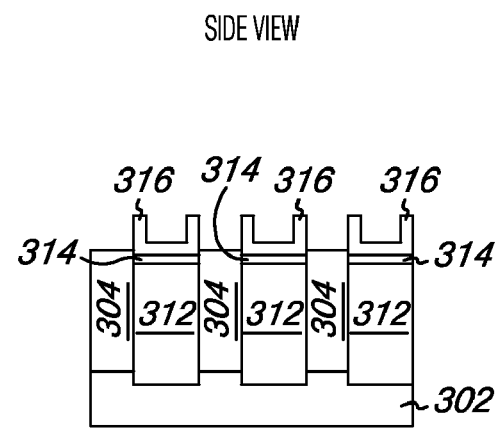

In FIGS. 3J-1 and 3J-2, the resulting structure is illustrated after the sacrificial oxide 318 has been removed and the oxide dielectric layer 304 has been leveled to beneath a top surface of the floating gates 316. The cell array structure is now as appears in the top view illustration of FIG. 3J-1 and in the side view of FIG. 3J-2 taken along cut line 3J-2.

Figures 1, 3K:
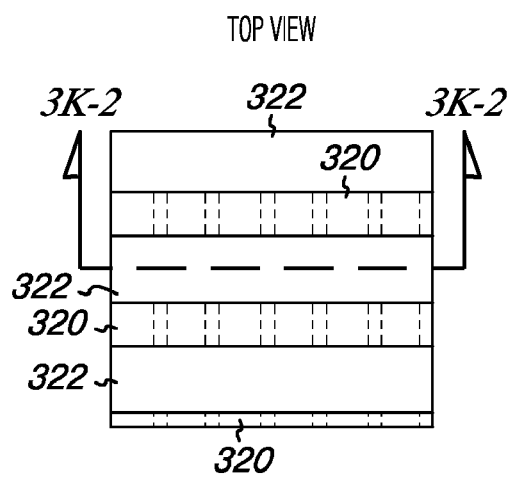
Figures 2, 3K:
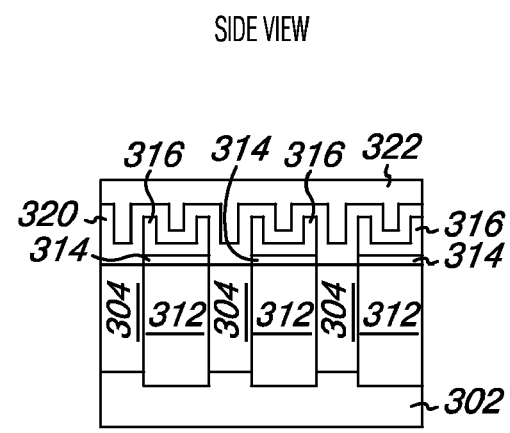

In FIGS. 3K-1 and 3K-2, the resulting NAND cell array structure is illustrated after a high vacuum oxide 320 is applied and a control gate material 322 is applied which can be patterned. The cell array structure is now appears in the top view illustration of FIG. 3K-1 and in the side view of FIG. 3K-2 taken along cut line 3J-2.

Figure 4A:
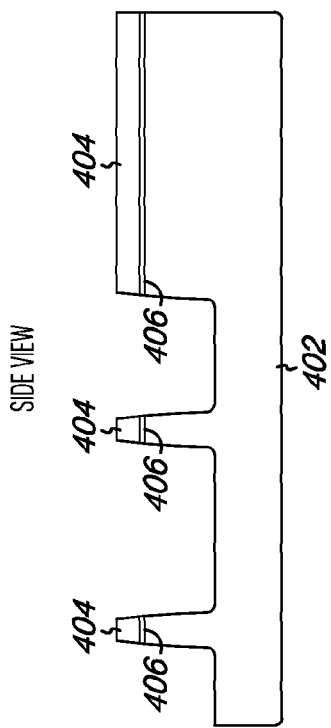
Figure 1:
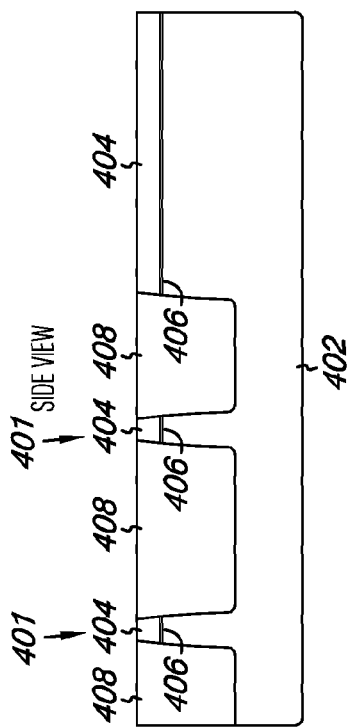
Figure 2:
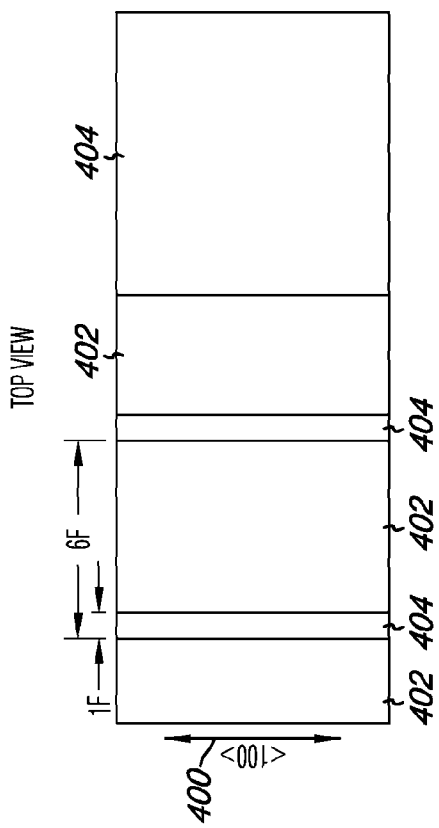

FIGS. 4A-1 through 4F-2 illustrates a dynamic random access memory (DRAM) process embodiment according to the present disclosure. FIG. 4A-1 illustrates a top view of a portion of a memory die, e.g., as can be formed on a semiconductor wafer as shown in FIG. 1. The illustrated portion is intended to represent that portion of a memory die whereupon a DRAM memory cell array is to be formed. As part of the processing a top surface of the wafer can be processed to include a top surface of single crystalline silicon having a (100) crystal plane.

The top view illustrated in FIG. 4A shows an embodiment in which strips of "Fins" 401 have been patterned into the silicon. One of ordinary skill in the art will appreciate the manner in which the wafer can be masked, patterned, and etched to create strips of silicon Fins on the wafer. In previous approaches a wafer would undergo DRAM processing using a registration intended to orient the processing steps in the <110> direction as shown in FIG. 1.

According to embodiments of the present disclosure, however, the wafer is rotated relative to the original <110> direction registration mark such that the wafer is oriented in the <100> direction as shown by arrow 400. In the embodiments described herein, it is while the wafer is oriented in the <100> direction that the top surface of the wafer is masked, patterned, and etched to create the strips of silicon Fins 401 on the wafer. As such, the strips of single crystalline silicon Fins shown in FIGS. 4A-4F-2 are oriented along the <100> direction of the underlying single crystalline silicon.

FIG. 4A-2 provides the cross-sectional side view taken along cut line 4A-2. FIG. 4A-2 illustrates that a pad oxide layer 406 and a silicon-nitride layer 404 masking material are used and patterned before etching to form the strips of single crystalline silicon Fins 401 on the wafer. The pad oxide 406 and nitride layer 404 can be deposited, for example, using CVD. A photolithographic etch process can be employed as used for the STI formation. In various embodiments a light wet nitride etch can be employed to reduce the nitride 404 critical dimension, e.g., from approximately 1.0 photolithographic feature (1F), above the single crystalline silicon Fins 401 and expose the single crystalline silicon along the nitride 404. The example embodiment of FIG. 4A-1 illustrates the single crystalline Fins 404 having a 1F dimension with a 6F dimension between the single crystalline silicon Fins 401. However, as the reader will appreciate the pattern can be modified to achieve various single crystalline silicon channel dimensions as tied to the substrate of the wafer.

Figure 4B:
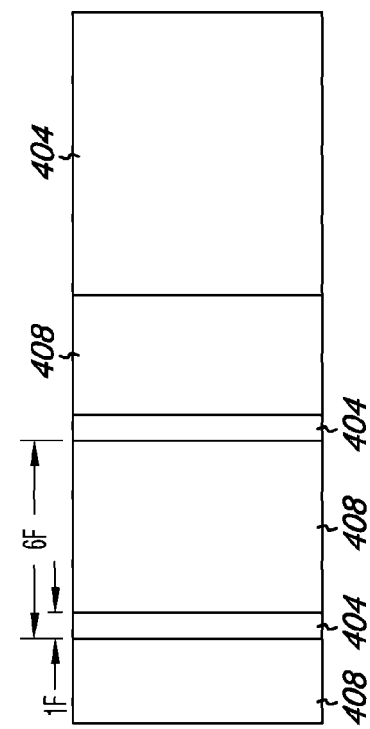

FIGS. 4B-1 and 4B-2 illustrate a top view and a side view of the portion of the die after a next sequence of processing steps. As shown in FIGS. 4B-1 and 4B-2 the structure of FIGS. 4A-1 and 4A-2 has been patterned for the addition of a buried oxide (BOX) 408 which has been filled into the space between the single crystalline silicon Fins 401 and planarized, e.g., using CMP, as part of the STI formation process. The side view of FIG. 4B-2 thus illustrates a cross sectional view of the structure taken along cut line 4A-2 in FIG. 4A-1. FIG. 4A-2 illustrates the BOX 408 between the single crystalline silicon Fins 401 formed in the single crystalline silicon surface 402 of the wafer. FIG. 4A-2 illustrates the pad oxide 406 and the nitride 408 remaining on the top of the single crystalline silicon Fins 401 oriented in strips along the <100> direction as well as on the top of the periphery to the DRAM memory cell array. The BOX 408 between the single crystalline silicon Fins 401 formed in the single crystalline silicon surface 402 of the wafer effectively provides isolation trenches. The BOX 408 embodiment in FIGS. 4B-1 and 4B-2 is illustrated without the inclusion of a nitride liner thereto.

FIGS. 4C-1 and 4C-2 illustrate a top view and a side view of the portion of the die after a next sequence of processing steps. In FIGS. 4C-1 and 4C-2 the BOX 408 has been recessed to below a top surface 409, as shown in FIG. 4D-2, of the single crystalline silicon Fins 401. According to various embodiments of the present disclosure, the exposed single crystalline silicon surfaces are pre-cleaned before next epitaxially growing single crystalline silicon 410 between trench walls 412 formed from recessing the BOX 408. In various embodiments the pre-clean includes exposing the single crystalline silicon of the trench walls 412 to the Fins 401 to a solution including a fluoride component, an oxidizing agent, and an inorganic acid. One example of exposing the single crystalline silicon of the trench walls 412 to a solution including a fluoride component, an oxidizing agent, and an inorganic acid is provided in a copending, commonly assigned U.S. patent application entitled, "Wet Etch Suitable for Creating Square Cuts in Si and Resulting Structures", Ser. No. 11/445,718, filed Jun. 2, 2006, which is incorporated in full herein.

FIG. 4C-2 illustrates a side view of the portion of the die after epitaxially growing the single crystalline silicon 410 from the trench walls 412. According to the process embodiments described herein the epitaxially grown single crystalline silicon 410 is substantially free of dislocations. That is, due to the process of epitaxially growing the single crystalline silicon 410 between dielectric walls, e.g., the nitride 404, oriented in the <100> direction relative to the exposed single crystalline silicon 402 any dislocations are pinned at the semiconductor/dielectric interface, e.g., along nitride walls 404. Thus, according to this example embodiment, the low defects enable DRAM access transistors to be formed, as described further below, in the epitaxial single crystalline silicon 410. In various embodiments, this achieves reduced stress in the active area of small geometry DRAM material to enable low defect retrograde access fins or recessed access devices (RADs) and Fin field effect transistor (FinFET) structures. As the reader will appreciate, the epitaxial single crystalline silicon 410 material can be cut across the trenches 412 by patterning and etching to enable isolation of DRAM or NOR devices using, for example, STI techniques in one direction of isolation.

In contrast, other process flows have tackled epitaxially growing single crystalline silicon over geometric features in silicon (Si) or silicon/germanium (Si/Ge) but these works have all directed their attention to dislocations being pinned at interfaces of the semiconductors. One example of this is provided in a copending, commonly assigned U.S. patent application entitled, "Integrated Circuits and Methods of Forming a Field Effect Transistor", application Ser. No. 11/076,774, filed Mar. 10, 2005, and which is incorporated in full herein.

The top view of FIG. 4C-1 illustrates the epitaxially grown single crystalline silicon 410 formed only between trench walls 412 of the single crystalline silicon Fins 410. However, the cross sectional view of FIG. 4C-2 illustrates that embodiments are not so limited and that the epitaxially grown single crystalline silicon may be grown to connect and form overtop the nitride 404.

FIGS. 4D-1 and 4D-2 illustrate a top view and a side view embodiment of the portion of the die after a next sequence of processing steps. In FIGS. 4D-1 and 4D-2 the epitaxially grown single crystalline silicon 410 is planarized, e.g., by CMP, to the nitride 404. The exposed nitride 404 and pad oxide 406 can next be removed, e.g., by using a wet strip, etc., to reveal the structure shown in the cross sectional view of FIG. 4D-2. As the reader will appreciate, an STI flow process can next be followed to continue with forming DRAM cells.

FIGS. 4E-1 and 4E-2 illustrate the structure after a next sequence of processing steps. As represented by the top view and side view embodiment of FIGS. 4E-1 and 4E-2 another pad oxide layer and another nitride layer can be deposited and patterned for the formation of additional trench isolation 412 and to define cell array active areas 414 and peripheral active areas 402. FIG. 4E-2 is a cross sectional view illustrating the same taken along 4E-2. A selective wet etch can be performed to remove the nitride and an HF clean can be performed to remove the pad oxide. FIGS. 4E-1 and 4E-2 illustrate both the exposed single crystalline silicon epitaxial regions 412 and the single crystalline silicon layer 402 of the wafer.

FIGS. 4F-1 and 4F-2 illustrate the structure after a next sequence of processing steps. Embodiments for integrated circuitry in fabrication of DRAM cell array and peripheral gate is represented by the top view and side view embodiment of FIGS. 4F-1 and 4F-2. In particular the cross sectional view shown in FIG. 4F-2 illustrates a number of gate structures 415-1, 415-2, 415-3, . . . , 415-N for the cell array and the peripheral gate 415-P. In various embodiments, each of the gate structures 415 includes a gate dielectric layer 416, a conductively doped polysilicon region 417, conductive metal or metal silicide region 418, and insulative caps 420. Electrically insulative sidewall spacers (not shown) are received about the respective gate structures. Electrically insulative material is illustrated at 408 (trench isolation BOX) and 412 (STI oxide for isolating adjacent devices) as the same have been described above.

In the cross sectional embodiment of FIG. 4F-2 the epitaxially grown single crystalline silicon 410 is illustrated as forming a source region 421 and a channel region 422. In this embodiment, the shared drain region 423 is illustrated as formed from the single crystalline silicon 402 of the wafer. The cell array structure is now as appears in the top view illustration of FIG. 4F-1 and in the side view of FIG. 4F-2 taken along cut line 4F-2. One of ordinary skill in the art will appreciate the manner in which electrically conductive contacts can be formed to connect with the source and drain regions, respectively, and the DRAM fabrication process continued and completed as suitable for particular implementations. As such more detail is not provided hereafter.

Figures 1, 5A:
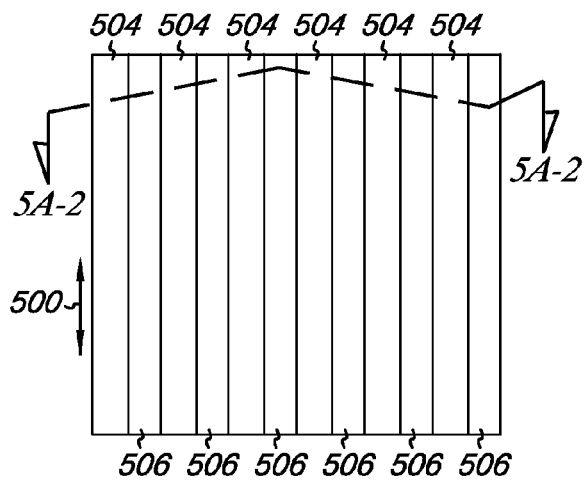
Figures 2, 5A:
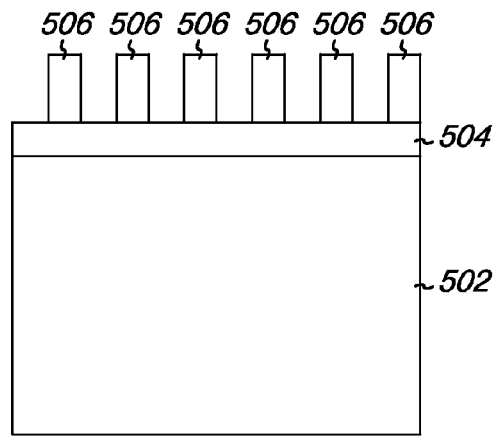

FIGS. 5A-1 through 5K-3-2 illustrates a pseudo silicon on insulator (PSOI) involving epitaxially grown single crystalline silicon process embodiment involving epitaxially grown single crystalline silicon according to the present disclosure. FIG. 5A-1 illustrates a top view of a portion of a memory die, e.g., as can be formed on a semiconductor wafer as shown in FIG. 1. The illustrated portion is intended to represent that portion of a memory die whereupon a DRAM memory cell array is to be formed. As part of the processing a top surface of the wafer can be processed to include a top surface of single crystalline silicon having a (100) crystal plane.

The top view illustrated in FIG. 5A shows an embodiment in which photo resist lines orthogonal to planned epitaxially single crystal silicon overgrowth in the <100> direction is planned. One of ordinary skill in the art will appreciate the manner in which the wafer can be masked and patterned. In previous approaches a wafer would undergo DRAM processing using a registration intended to orient the processing steps in the <110> direction as shown in FIG. 1.

According to embodiments of the present disclosure, however, the wafer is rotated relative to the original <110> direction registration mark such that the wafer is oriented in the <100> direction as shown by arrow 500. In the embodiments described herein, it is while the wafer is oriented in the <100> direction that the top surface of the wafer is masked and patterned to create the strips of photo resist lines 506 on the wafer.

FIG. 5A-2 provides the cross-sectional side view taken along cut line 5A-2. FIG. 5A-2 illustrates that a silicon-nitride 504 hardmask layer has been applied beneath the patterned strips of photo resist lines 506 in the <100> direction and over the underlying substrate 502 of the wafer. One of ordinary skill in the art will appreciate that the substrate 502 portion shown can include bulk semiconductive silicon comprising material and may include a layer of single crystalline silicon.

Figures 1, 5B:
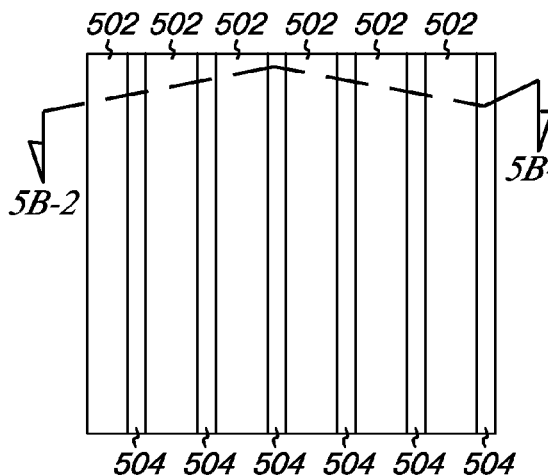
Figures 2, 5B:
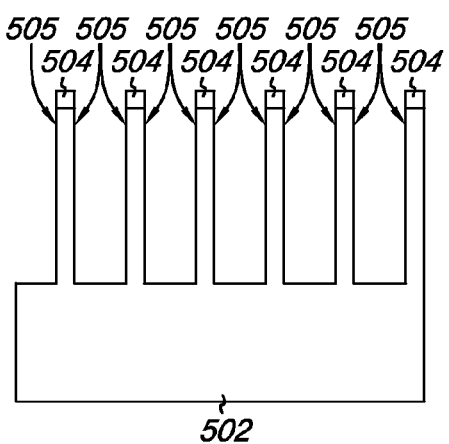

FIGS. 5B-1 and 5B-2 illustrate a top view and a side view of the portion of the die after a next sequence of processing steps. As shown in embodiment of FIGS. 5B-1 and 5B-2 the structure of FIGS. 5A-1 and 5A-2 has undergone an anisotropic etch to etch into the nitride hardmask 504 and the single crystalline silicon 502. In particular the cross sectional view of FIG. 5B-2 illustrates the trench walls 505 formed in the <100> direction in the single crystalline silicon 502 from the etch process above. In various embodiments, the trenches can be formed to a depth in the range of 500 to 3000 Angstroms. Embodiments, however, are not limited to this example.

Additionally, using various photolithographic techniques, a width to the trenches can be patterned to provide a particular dimension to the trenches. However, due to factors such as optics and light or radiation wavelength, photolithography techniques each have a minimum pitch below which a particular photolithographic technique cannot reliably form features. Pitch is defined as the distance between an identical point in two neighboring features. These features are typically defined by openings in, and spaced from each other by, a material, such as an insulator or conductor. As a result, pitch can be viewed as the sum of the width of a feature and of the width of the space separating that feature from a neighboring feature.

As one of ordinary skill in the art will appreciate "pitch doubling" is one method for extending the capabilities of photolithographic techniques beyond their minimum pitch and can be used in forming the trenches shown in various embodiments. One example method for the same is described in U.S. Pat. No. 5,328,810, issued to Lowrey et al., the entire disclosure of which is incorporated herein by reference. As a result, the smallest feature size possible with a photolithographic technique is effectively decreased. It will be appreciated that while the pitch is actually reduced by such techniques this reduction in pitch can be referred to as pitch "doubling" or more generally, pitch "multiplication". That is, "multiplication" of pitch by a certain factor actually involves reducing the pitch by that factor. This terminology is retained herein. Note that by forming spacers upon spacers, the definable feature size can be further decreased. Thus, pitch multiplication refers to the process generally, regardless of the number of times the spacer formation process is employed.

Figures 1, 5C:
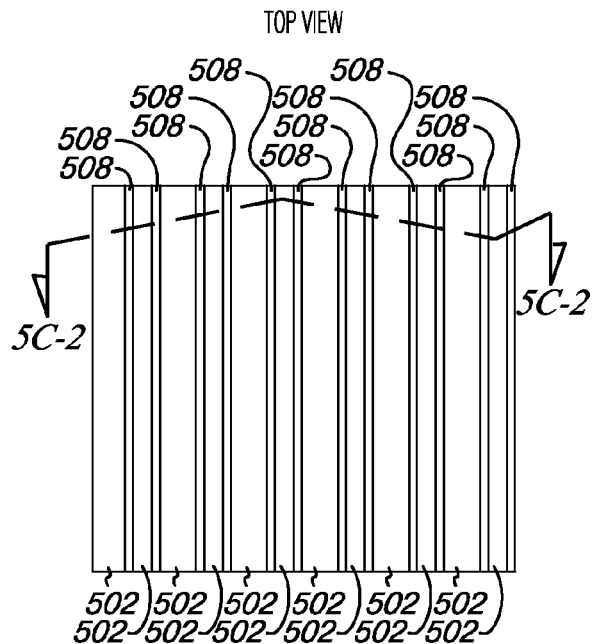
Figures 2, 5C:
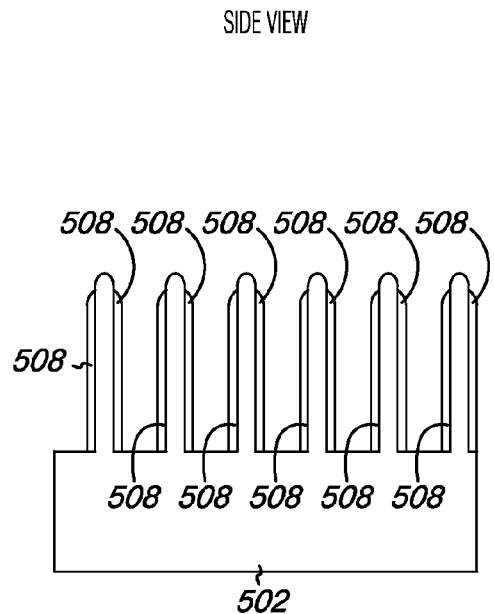

FIGS. 5C-1 and 5C-2 illustrate a top view and a side view of the portion of the die after a next sequence of processing steps. As shown in embodiment of FIGS. 5C-1 and 5C-2 an optional silicon nitride ($Si_3N_4$) liner and spacer etch can be performed to create nitride spacers 508 along trench walls 505 of the single crystalline silicon 502. The structure is now as appears in FIGS. 5C-1 and 5C-2.

According to various embodiments the exposed surfaces are pre-cleaned before next epitaxially growing single crystalline silicon from the exposed portions of single crystalline silicon on the trench walls 505. In various embodiments the pre-clean includes exposing the single crystalline silicon 502 to a solution including a fluoride component, an oxidizing agent, and an inorganic acid. One example of exposing the single crystalline silicon 502 to a solution including a fluoride component, an oxidizing agent, and an inorganic acid is provided in a copending, commonly assigned U.S. patent application entitled, "Wet Etch Suitable for Creating Square Cuts in Si and Resulting Structures", Ser. No. 11/445,718, filed Jun. 2, 2006, which is incorporated in full herein.

Figures 1, 5D:
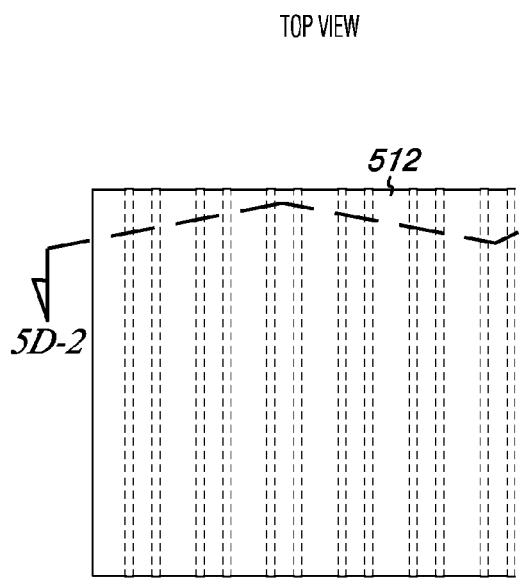
Figures 2, 5D:
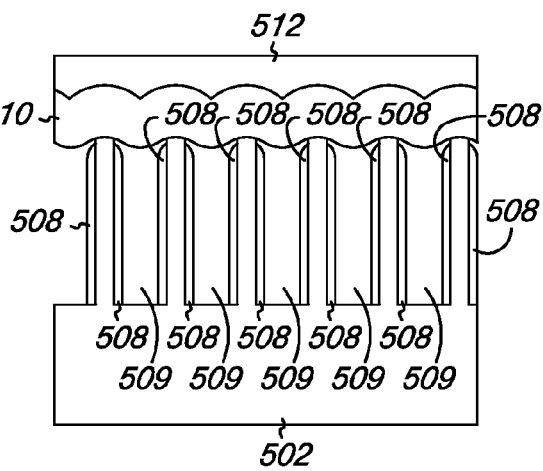

FIGS. 5D-1 and 5D-2 illustrate a top view and a side view of the portion of the die after a next sequence of processing steps. In FIGS. 5D-1 and 5D-2 single crystalline silicon has been epitaxially grown from the exposed single crystalline silicon 502 with merging fronts 510. In various embodiments an optional polysilicon layer 512 is applied over the top, e.g., via CVD. According to the embodiments described herein, the epitaxial overgrowth 510 above the dielectric fins, e.g., nitride spacers 508 is substantially free of dislocations. That is, due to the process of epitaxially overgrowing the single crystalline silicon 510 as would be the portion in between the dielectric 508, as described in connection with FIGS. 3 and 4, hence enabling a PSOI DRAM access transistor to be formed as described further below.

According to various embodiments, the dielectric (here, nitride spacers 508) can be recessed to allow epitaxial silicon growth 510 over the gaps 509 which will merge (100) single crystalline silicon planes. As the reader will appreciate this embodiment allows PSOI DRAM devices without using two (2) CMPs.

Figures 1, 2, 5E:
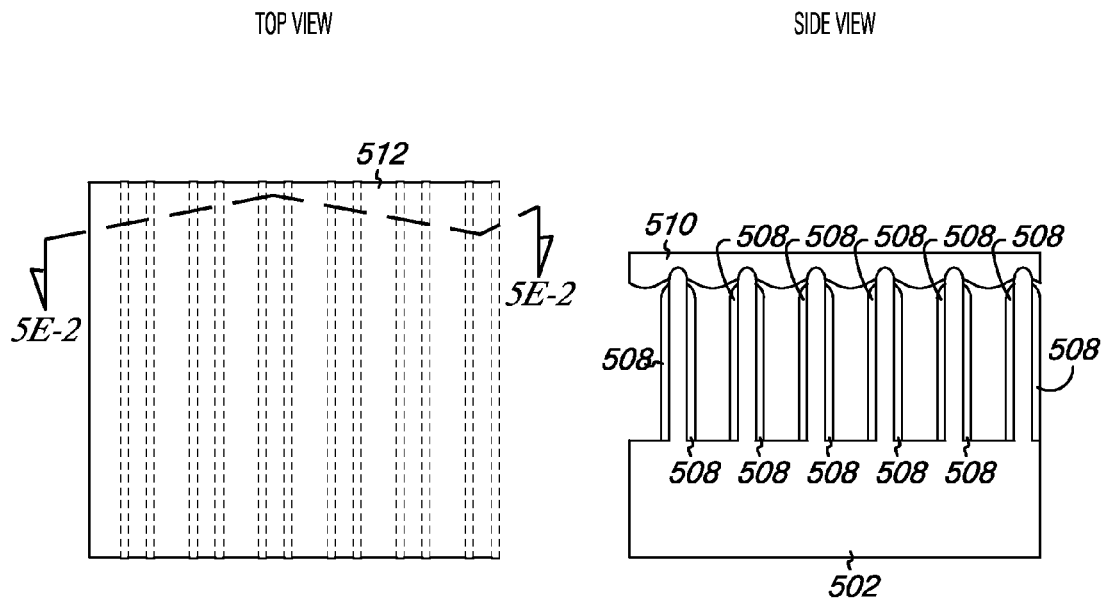

FIGS. 5E-1 and 5E-2 illustrate a top view and a side view of the portion of the die after a next sequence of processing steps. In FIGS. 5E-1 and 5E-2 an optional silicon buff polish can be performed to planarize. As the reader will appreciate the top surface may be planarized and pattered to open some of the dielectric wall, e.g., nitride spacers 508, to enable recessed access device (RAD) construction. Also, dielectric wall height oriented in the <100> direction can be set be recessing the dielectric in some places and not others prior to opening the single crystalline silicon for epitaxial single crystalline silicon growth.

Figures 1, 2, 5F:
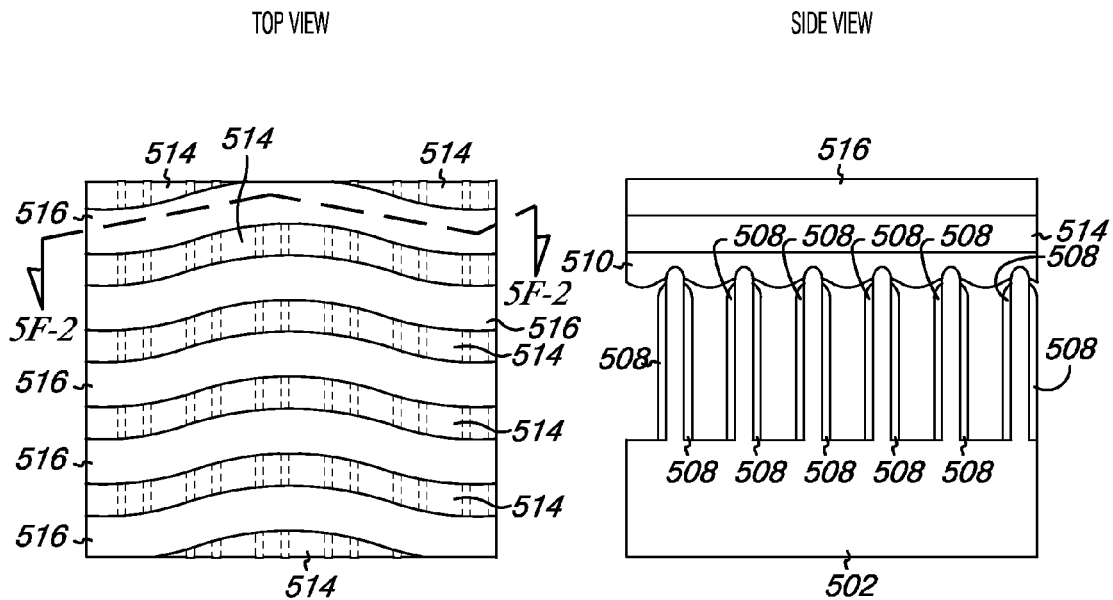

FIGS. 5F-1 and 5F-2 illustrate a top view and a side view of the portion of the die after a next sequence of processing steps. As shown in FIGS. 5F-1 and 5F-2 a nitride hardmask is deposited, e.g., via CVD, and can be patterned 516 using various photolithographic techniques to create a patterned nitride 514 over the epitaxially grown single crystalline silicon 510 as will be used to define islands in STI oxide.

Figures 1, 2, 3, 5H:
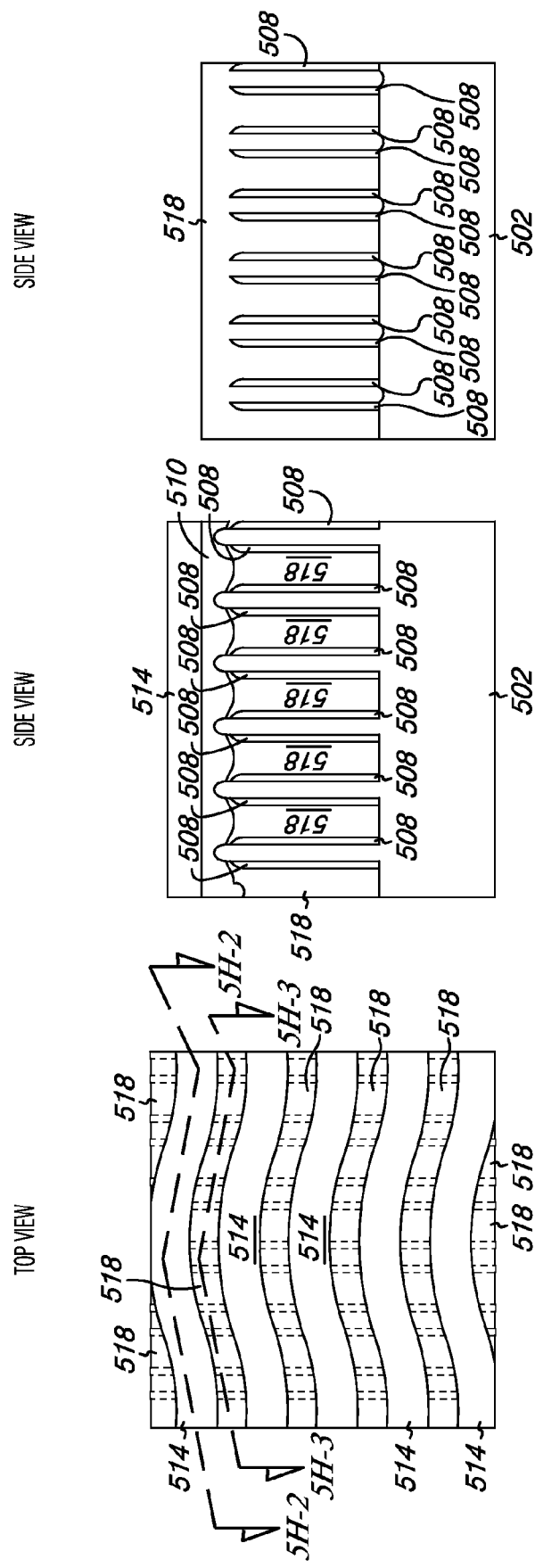

FIG. 5G-1 illustrates a top view of the portion of the die after the next sequence of processing steps. FIGS. 5G-2 and 5G-3 illustrate cross sectional views taken along cut lines 5G-2 and 5G-3, respectively, shown in FIG. 5G-1. In FIGS. 5G-1, 5G-2, and 5G-3 the nitride 514 and epitaxially grown single crystalline silicon 510 have been etched using a plasma dry etch, e.g., using a Br, Ar base gas recipe, to define islands 511 as shown by contrasting cross sectional views of FIGS. 5G-2 and 5G-3 along those respective cut lines from 5G-1 as well as undercut source/drain regions 509. The nitride spacers 508 shown in FIG. 5G-3 can optionally be removed by a dry etch or a wet etch.

FIG. 5H-1 illustrates a top view of the portion of the die after the next sequence of processing steps. FIGS. 5H-2 and 5H-3 illustrate cross sectional views taken along cut lines 5H-2 and 5H-3, respectively, shown in FIG. 5H-1. In FIGS. 5H-1, 5H-2, and 5H-3 a spin on dielectric (SOD) oxide deposition 518 and planarization, e.g. via CMP, have been performed to complete the STI sequence. The structure is now as appears in FIGS. 5H-1, 5H-2, and 5H-3 showing oxide 518 in the undercut source/drain regions in the view of 5H-2 and in isolation regions outside of the active regions of the devices to be formed in the view of 5H-3.

FIGS. 5I-1 illustrates a top view of the portion of the die after the next sequence of processing steps. FIGS. 5I-2 and 5I-3 illustrate cross sectional views taken along cut lines 5I-2 and 5I-3, respectively, shown in FIG. 5I-1. In FIGS. 5I-1, 5I-2, and 5I-3 the nitride 514 from FIGS. 5H-1, 5H-2, and 5H-3 has been removed, e.g., using a nitride wet etch or other suitable technique.

FIG. 5J-1 illustrates a top view of the portion of the die after the next sequence of processing steps. FIGS. 5J-2 and 5J-3 illustrate cross sectional views taken along cut lines 5J-2 and 5J-3, respectively, shown in FIG. 5J-1. In FIGS. 5J-1, 5J-2, and 5J-3 the structure illustrates a DRAM device array having gates 519 over the silicon island body ties 511. The gates 519 and source/drain regions (not enumerated) can be formed, for example, according to the process embodiment described above in connection with FIGS. 4F-1 and 4F-2. That is each of the gates 519 can be formed to include a gate dielectric layer 520, a conductively doped polysilicon region 521, conductive metal or metal silicide region 522, and insulative caps 523. The gates 519 are thus formed over the epitaxially grown single crystalline silicon 510 which serves as a channel region connected to island 511 body ties as shown in cross sectional view 5J-2 and pass over the oxide isolation material 518 outside of the active areas of the DRAM cells as shown in the cross sectional view of 5J-3. The source/drain regions are thus formed in the epitaxially grown single crystalline silicon 510 undercut by the oxide isolation material 518 as shown in the cross sectional view of FIG. 5J-2. One of ordinary skill in the art will appreciate the manner in which electrically conductive contacts can be formed to connect with the source and drain regions, respectively, and the DRAM fabrication process continued and completed for the PSOI DRAM devices according to these embodiments as suitable for particular implementations. As such more detail is not provided hereafter.

Figure 6:
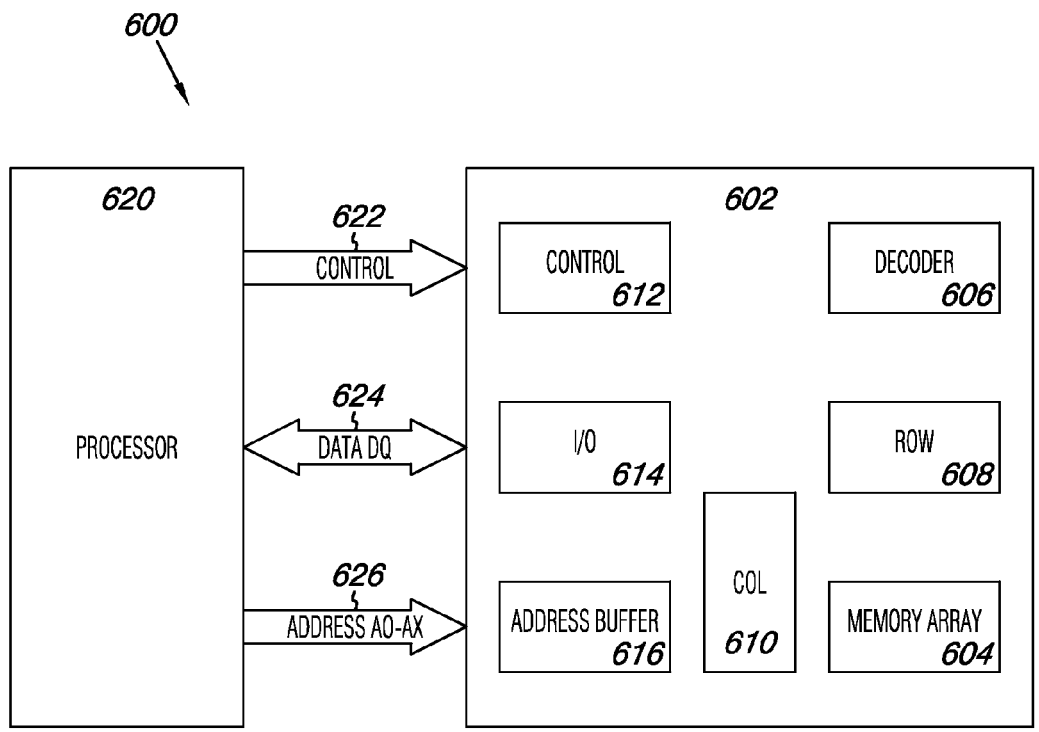
FIG. 6 illustrates an example of an embodiment of an electronic system which includes structures formed in epitaxially grown silicon according to the embodiments of the present disclosure.

FIG. 6 illustrates an example of an embodiment of an electronic system 600 which includes structures formed in epitaxially grown silicon according to the embodiments of the present disclosure. The system 600 illustrated in the embodiment of FIG. 6 includes a memory device 602 that includes an array of memory cells 604 formed according to the embodiments described herein, an address decoder 606, row access circuitry 608, column access circuitry 610, control circuitry 612, Input/Output (I/O) circuitry 614, and an address buffer 616.

Electronic system 600 includes an external processor 620, e.g., a memory controller or host processor, electrically connected to memory device 602 for memory accessing. The memory device 602 receives control signals from the processor 620 over a control link 622. The memory cells are used to store data that are accessed via a data (DQ) link 624. Address signals are received via an address link 626 that are decoded at address decoder 606 to access the memory array 604. Address buffer circuit 616 latches the address signals. The memory cells are accessed in response to the control signals and the address signals.

Figure 7:
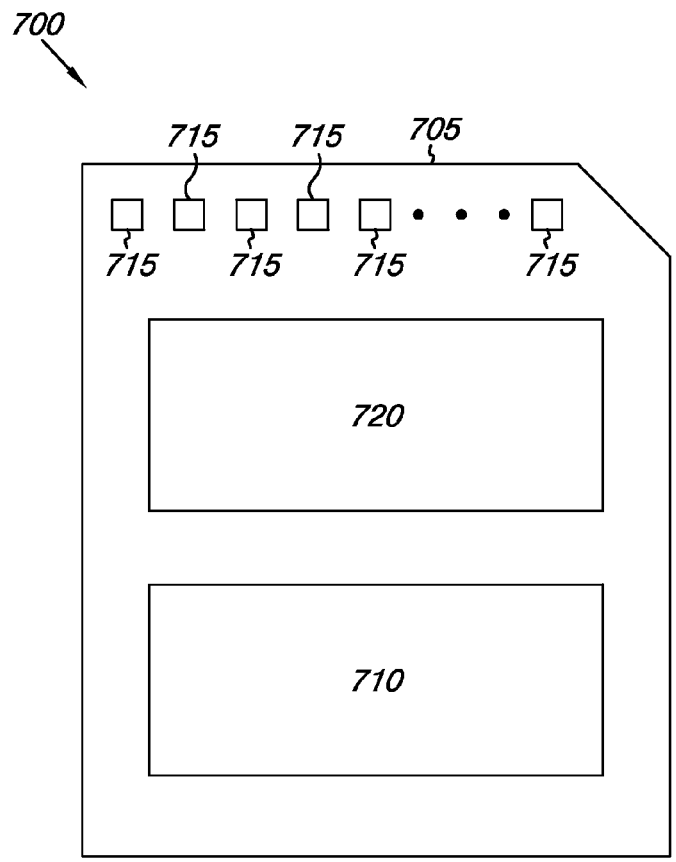
FIG. 7 is a functional block diagram of a memory module having at least one memory device having structures formed in epitaxially grown silicon according to the embodiments of the present disclosure.

FIG. 7 is a functional block diagram of a memory module 700 having at least one memory device having structures formed in epitaxially grown silicon according to the embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 to enclose one or more memory devices 710, though such a housing is not essential to all devices or device applications. The housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Memory cell structures, including PSOIs, NANDs, NORs, FinFETs, etc., and methods of fabrication have been described that include a method of epitaxial silicon growth. The method includes providing a silicon layer on a substrate. A dielectric layer is provided on the silicon layer. A trench is formed in the dielectric layer to expose the silicon layer, the trench having trench walls in the <100> direction. The method includes epitaxially growing silicon between trench walls formed in the dielectric layer. The single crystalline silicon is grown substantially free of dislocations. That is, the various techniques described herein provide a process of epitaxially growing the single crystalline silicon oriented in the <100> direction relative to the underlying silicon crystalline structures such that any defects are pinned at semiconductor/dielectric interfaces, e.g., along trench walls.

In various embodiments, such epitaxially grown single crystalline silicon can be grown substantially free of dislocations at multiple elevations and then overgrowth methods used to create defect free silicon over silicon (SOS), hence stacking devices, e.g., transistors at multiple levels. Other devices such as pass gates or local amplifiers atop contacts which contact lower level gate and source/drain regions could similarly be constructed using the embodiments described herein. Additionally building micro electro mechanical (MEM) structures or optical electrical devices out of silicon on (100) crystal planes may be enabled by the ability to put down substantially defect free epitaxially grown single crystalline silicon as described herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A NAND array of memory cells, comprising:
   a number of non-volatile memory cells having floating gates formed over epitaxially (epi) grown single crystalline silicon, wherein the epi grown single crystalline silicon is formed between dielectric walls oriented in a <100> direction relative to the epi grown single crystalline silicon; and
   wherein the NAND array has a feature size of not more than approximately 20 nanometers (nm).

2. The memory cell array of claim 1, wherein the epi grown single crystalline silicon is substantially defect free having dislocations pinned between the epi grown single crystalline silicon and the dielectric walls.

3. The memory cell array of claim 1, wherein the epi grown single crystalline silicon is formed over a single crystalline silicon layer having a (100) crystal plane.

4. The memory cell array of claim 1, wherein a high vacuum oxide is formed over the floating gates.

5. A memory cell array, comprising:
   a number of DRAM cells located above a dielectric isolation material formed in a trench without a nitride liner, wherein each DRAM cell includes:
      a gate located above a channel region formed in a layer of epitaxially (epi) grown single crystalline silicon;
      a source region adjacent the channel and formed in the layer of epi grown single crystalline silicon; and
      a drain region adjacent the channel and formed in the layer of epi grown single crystalline silicon; and
   wherein the DRAM cells are separated by single crystalline silicon Fins with a photolithographic feature dimension of approximately 1.0 (1F).

6. The memory cell array of claim 5, wherein the epi grown single crystalline silicon is substantially defect free having dislocations pinned between the epi grown single crystalline silicon and the dielectric isolation material.

7. The memory cell array of claim 5, wherein the trench includes walls oriented in a <100> direction relative to the epi grown single crystalline silicon.

8. The memory cell array of claim 5, wherein the single crystalline silicon Fins are separated with a photolithographic feature dimension of approximately 6.0 (6F).

9. The memory cell array of claim 5, wherein the layer of epi grown single crystalline silicon is formed over a single crystalline silicon layer having a (100) crystal plane.

10. A memory cell array, comprising:
    a number of devices located above a dielectric isolation material, wherein the devices are formed from epitaxially (epi) grown single crystalline silicon, the epi grown single crystalline silicon having a number of fins of silicon connecting the epi grown single crystalline silicon through the dielectric isolation material to a substrate;
    a wall surface of the number of fins oriented in a <100> direction relative to the epi grown single crystalline silicon.

11. The memory cell array of claim 10, wherein the number of devices are part of a recessed access device (RAD).

12. The memory cell array of claim 10, wherein the number of devices are part of a micro electro mechanical (MEM) structure.

13. The memory cell array of claim 10, wherein the number of devices are part of an optical electrical device.

14. The memory cell array of claim 10, wherein the number of fins have a feature size obtained according to a pitch multiplication technique.

15. The memory cell array of claim 10, wherein the number of devices are DRAM cells, and wherein each DRAM cell includes:
    a gate located above a channel region formed in the epi grown single crystalline silicon;
    a source region adjacent the channel and formed in the epi grown single crystalline silicon; and
    a drain region adjacent the channel and formed in the epi grown single crystalline silicon.

16. The memory cell array of claim 10, wherein the number of devices include a pass gate coupled to the epi grown single crystalline silicon.

17. The memory cell array of claim 10, wherein the number of devices include a local amplifier coupled to the epi grown single crystalline silicon.

* * * * *